(12) United States Patent
Cioaca

(10) Patent No.: US 6,822,908 B1
(45) Date of Patent: Nov. 23, 2004

(54) SYNCHRONOUS UP/DOWN ADDRESS GENERATOR FOR BURST MODE READ

(75) Inventor: Dumitru Cioaca, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/431,718

(22) Filed: May 8, 2003

(51) Int. Cl.$^7$ .............................................. G11C 16/06
(52) U.S. Cl. ............................ 365/185.23; 365/230.08; 365/233
(58) Field of Search ....................... 365/185.23, 230.08, 365/233

(56) References Cited

U.S. PATENT DOCUMENTS

| | | | |
|---|---|---|---|
| 5,208,480 A | 5/1993 | Ishibashi | |
| 5,862,099 A | * 1/1999 | Gannage et al. | ........ 365/185.23 |
| 6,163,500 A | * 12/2000 | Wilford et al. | ........ 365/230.08 |

* cited by examiner

*Primary Examiner*—Huan Hoang
(74) *Attorney, Agent, or Firm*—Leffert Jay & Polglaze, P.A.

(57) ABSTRACT

A symmetrical divide-by-2 circuit has a master latch made up of two inverters. The circuit has an inverter on each output. The capacitance of these inverters forms a dynamic slave latch that is connected to the master latch through a transmission gate on each master latch output. The data is transferred from the master latch to the dynamic slave latch every clock cycle by an enable clock and an inverse of the enable clock. Capacitance leakage is reduced by the transmission gates until the next clock cycle. The circuit is clocked by a one-shot clock that is self-aligning to the latest transition of either the enable clock or inverse enable clock.

27 Claims, 7 Drawing Sheets

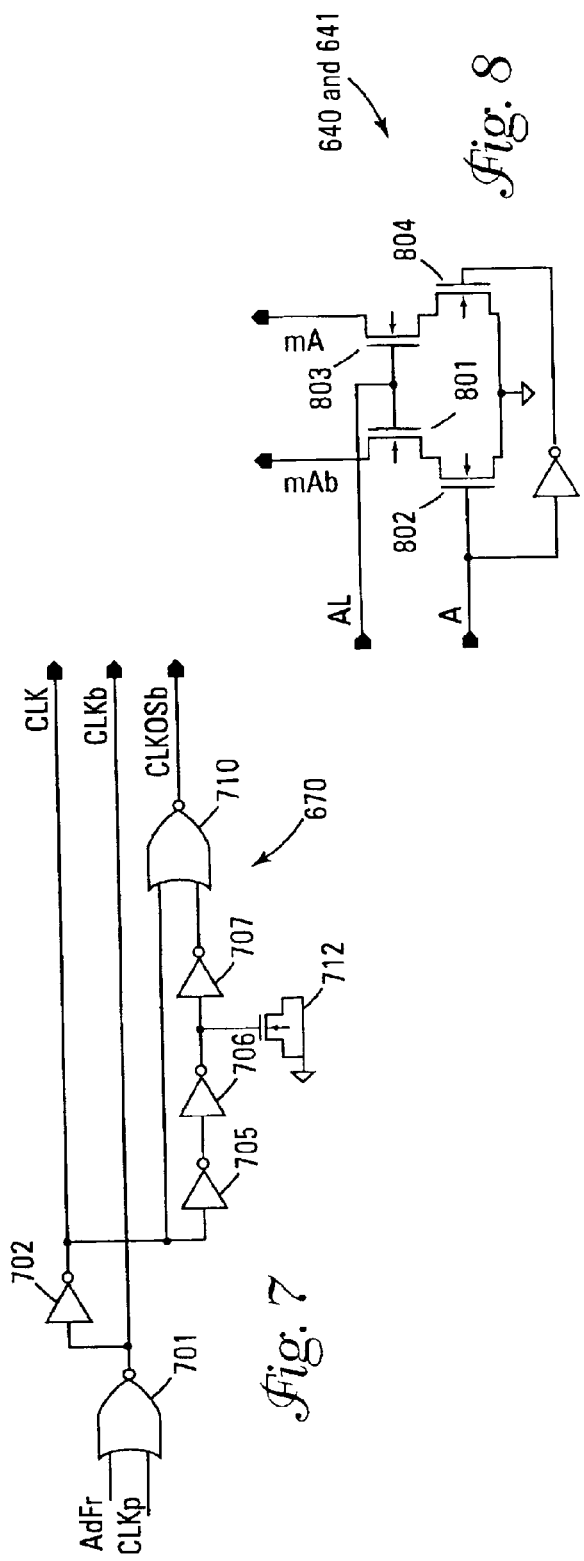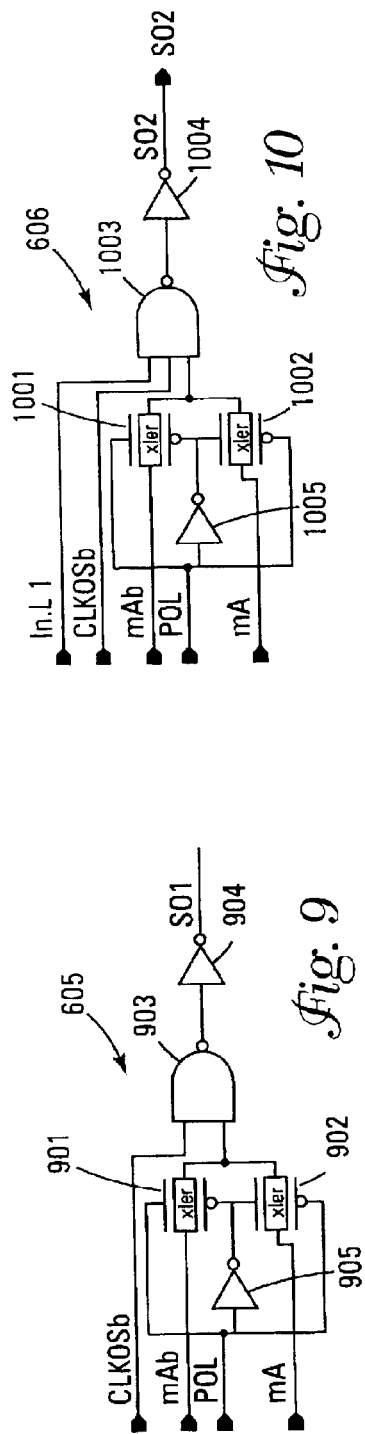

US 6,822,908 B1

SYNCHRONOUS UP/DOWN ADDRESS GENERATOR FOR BURST MODE READ

TECHNICAL FIELD OF THE INVENTION

The present invention relates generally to address counters and in particular the present invention relates to up/down address counters in memory devices.

BACKGROUND OF THE INVENTION

Memory applications increasingly require higher speed access, lower voltage, and greater density. Higher density and lower voltages, however, tend to reduce performance in standard random access memory architectures. To achieve faster access times, a burst read mode has been developed. Burst read mode devices offer improvements in speed and performance by reducing sequential read access times to the memory device.

Burst read mode is typically tied to one edge of an input clock signal. The controller or microprocessor supplies only the initial address to the memory device and a counter in the device counts up a predetermined number of addresses from the specified start location.

FIG. 1 illustrates a typical prior art address generator. The generator uses address latches 101–103 that are connected as an asynchronous counter. In an asynchronous read mode, the address latches 101–103 are comprised of two serially connected latches 108 and 109. These are the master latch 108 and the slave latch 109. The three latches 101–103 illustrated in FIG. 1 are substantially similar. Therefore, only a brief description will be given regarding the first address latch 101 that applies to all of the address latches.

When the burst signal 110 is high (i.e., burst read mode disabled), the first transmission gates 105 in each of the address latches are disabled while the other transmission gates 106 are enabled. When the burst mode is disabled, the transmission gates 116, 118, 120, and 122 are disabled. Furthermore, when the burst mode is disabled, the latch circuits 101, 102, and 103 become simple independent address buffers for the address signals connected to A0pad, A1pad, and A2pad since the signal AL 124 is always high when the burst mode is disabled.

When the burst signal BURSt 110 is low (i.e., BURST read mode enabled), the clock signal CLKp 126 is allowed to pass through the NOR gate 128 in inverted form and through the inverter 130 in non-inverted form. By doing so, the first latch circuit 101 becomes a toggle flip-flop (divide-by-2) and its outputs, A0 and A0b, change state at every rising edge of CLKp 126. Similarly, the second latch circuit 102 is a toggle flip-flop using A0 and A0b as clocks. A1 and A1b change state at every rising edge of A0. Similarly, the third latch circuit 103 is a toggle flip-flop. Its outputs, A2 and A2b, change state at every rising edge of A1.

The address generator 100 starts generating addresses from an initial address stored in the counter with the help of signal AL 124. When this signal 124 is high, the address presented at A0pad, A1pad, and A2pad is stored in 101, 102 and 103 respectively. AL 124 is also an input for NOR gate 128 for this operation. After the initial starting address of the counter is stored in 101, 102, and 103, AL changes from high to low and the address generator 100 generates a new address for every CLKp 126 rising edge.

These addresses are labeled as A0, A1, and A2. At every clock cycle of CLKp the address configuration A0, A1, A2, A0b, A1b, and A2b at the output of the address counter 100 increases by one bit.

The output addresses are input to a decoder 112 that generates a word selecting signal W0–W7 depending on the state of the address lines. The W0–W7 signals are input to a multiplexer 114 to select one set of 16 data out lines from the 128 data line input.

The address generator of FIG. 1 has the advantage of being simple but does not work well at high clock speeds during a burst read operation. This is because its total delay from address generating signal, CLKp, to the generated addresses, A0, A1, and A2, is given by the slowest address generated: A2. Given the serial connection of the divide-by-2 units 101–103, the total delay of A2 is a sum of the delay of each of the units 101–103 to CLKp.

An additional problem is that the divide-by-2 units 101–103 produce the non-inverted and inverted address signals (i.e., A0, A0b, A1, A1b, A2, A2b) separated by one gate delay 115. This causes the decoder 112 to select two words for a time equal to that gate delay, thus causing data contention on the output bus. This reduces the burst read speed of the address generator 100.

For the reasons stated above, and for other reasons stated below which will become apparent to those skilled in the art upon reading and understanding the present specification, there is a need in the art for faster burst read address generator to increase the burst read speeds in a memory device.

SUMMARY

The above-mentioned problems with memory testing and other problems are addressed by the present invention and will be understood by reading and studying the following specification.

The present invention encompasses a symmetrical divide-by-2 circuit comprising a master latch that holds a data signal and is coupled to a dynamic slave latch through a plurality of transmission gates. The dynamic slave latch capacitively stores, for a predetermined time interval, the data signal transferred from the master latch. In one embodiment, this predetermined time interval is one-half clock cycle.

In one embodiment, the symmetrical divide-by-2 circuit can be used in an address generator in a memory device during a burst read operation. Such an embodiment comprises a plurality of address inputs for accepting a burst read start address. A plurality of the symmetrical divide-by-2 circuits are organized in successive stages. A clock generator circuit that has a one-shot circuit generates an address increment/decrement clock to each of the stages such that the burst read start address is either incremented or decremented in response to a polarity signal. The clock generator circuit further generates an enable clock and an inverse enable clock that are coupled to the transmission gates for enabling a transfer of data from the master latch to the slave latch.

Further embodiments of the invention include methods and apparatus of varying scope.

BRIEF DESCRIPTION OF THE DRAWINGS

FIG. 7 shows a schematic diagram of one embodiment of a clock generator circuit of the present invention.

FIG. 8 shows a schematic diagram of one embodiment of an address input circuit of the present invention.

FIG. 9 shows a schematic diagram of one embodiment of a logic circuit of the present invention.

FIG. 10 shows a schematic diagram of another embodiment of a logic circuit of the present invention.

DETAILED DESCRIPTION

Figure 1:
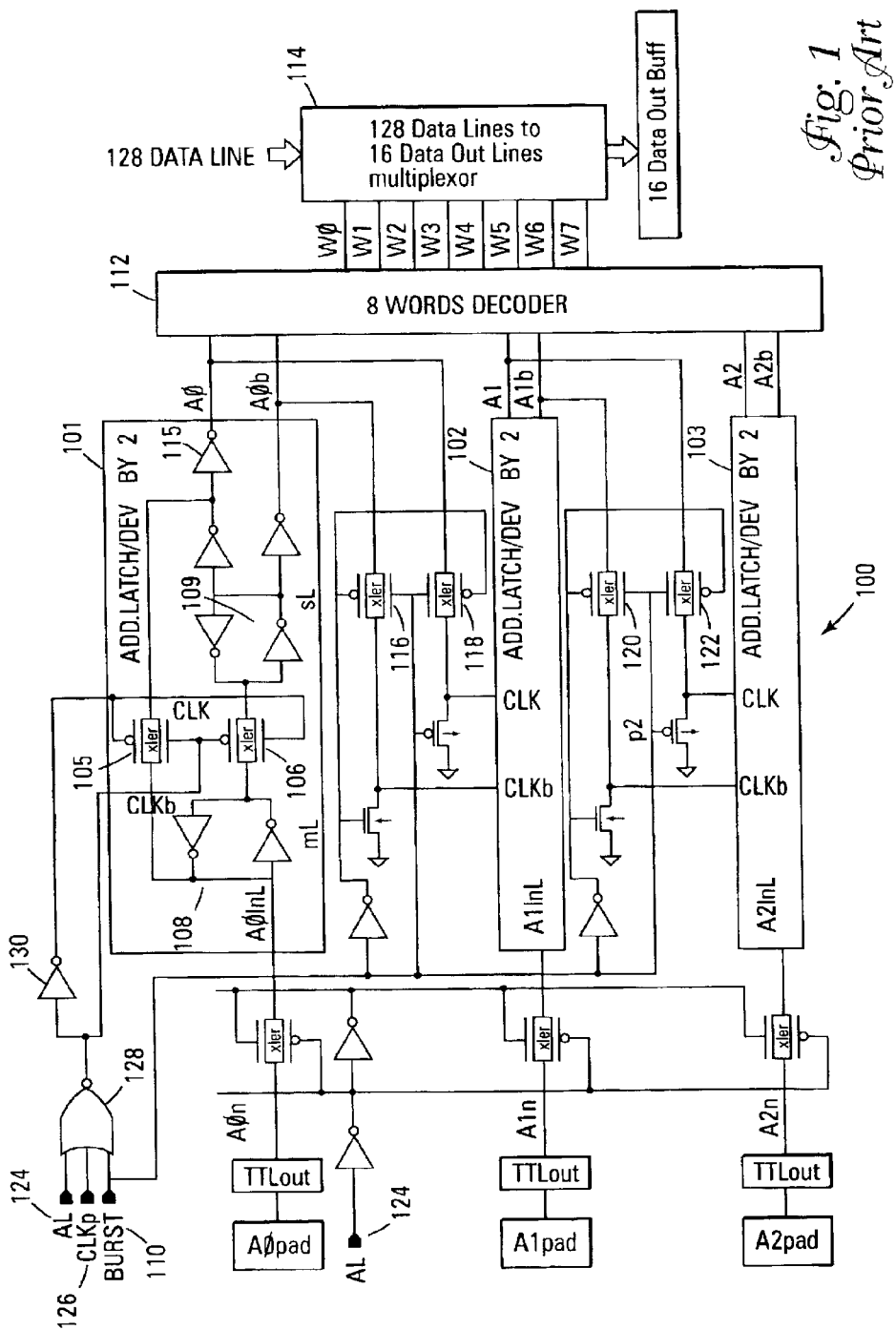
FIG. 1 shows a block diagram of a typical prior art address generator for use in a burst read mode of a memory device.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
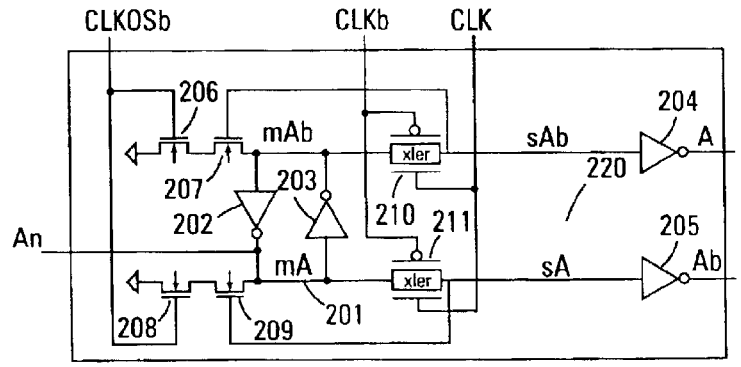
FIG. 2 shows a schematic diagram of one embodiment of a symmetrical divide-by-2 circuit of the present invention.

FIG. 2 illustrates a schematic diagram of one embodiment of a symmetrical divide-by-2 circuit of the present invention. This embodiment includes a master latch 201 that is made up of two inverters 202 and 203. Data is written to the master latch through an input data line. In one embodiment, the input data is an address signal.

The slave latch of the prior art is replaced by the gate capacitance of the output inverters 204 and 205 and the gate capacitance of two transistors 207 and 209. This capacitance creates a dynamic slave latch 220 in which data can be capacitively stored. When the transmission gates 210 and 211 are disabled (i.e., nonconductive), the data is stored in the dynamic slave latch 220 (sA, sAb). The short cycle time of the clock does not allow the gate capacitance to discharge through diffusion leakage of the transmission gates 210 and 211. Therefore, the data will remain in the dynamic slave latch 220 until it is changed by the next clock cycle. For one half of the clock cycle the dynamic latch sA, sAb is directly connected to the master latch 201 through the transmission gates 210 and 211. For the other half of the clock cycle, the transmission gates 210 and 211 are disabled and the data is stored dynamically in the dynamic slave latch 220 (sA, sAb).

The feedback transistors 206–209 are enabled in order to change the data of the master latch 201 in accordance with the data stored in the dynamic slave latch 220. The data change occurs on one edge of a clock signal CLKOSb. As discussed subsequently, CLKOSb is generated by a one-shot circuit using the edges of the clock signals CLK and CLKb, whichever edge occurs last. These clock signals (CLK and CLKb) are also used to enable/disable the transmission gates 210 and 211 such that the feedback transistors 206 and 207 are not conductive at the same time as the transmission gates 210 and 211.

Figure 3:
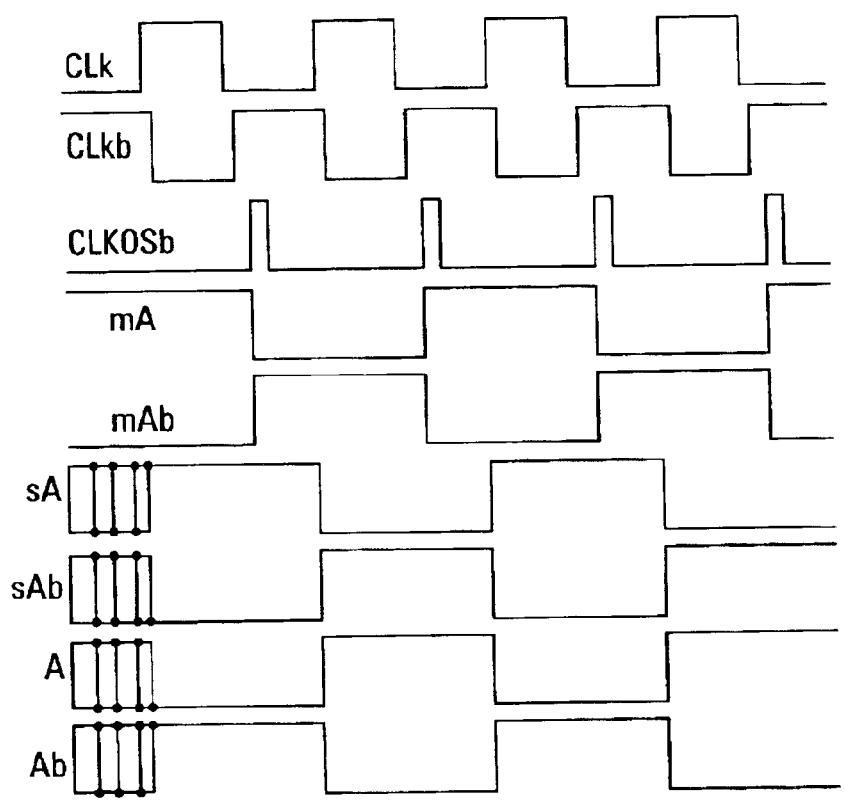
FIG. 3 shows a timing diagram in accordance with the embodiment of FIG. 2.

FIG. 3 illustrates a timing diagram in accordance with the embodiment of FIG. 2. Two of the clock signals of the embodiment of FIG. 2 are CLK and CLKb. Since the CLKb signal is an inverted version of the CLK signal, there is a gate delay between the transitions. This is illustrated by the slight difference between the edges of CLK and CLKb.

The CLKOSb signal is generated by a one-shot circuit as discussed subsequently with reference to FIG. 7. This signal is generated by the later occurring edge of either CLK or CLKb. The CLKOSb signal causes the latched address, mA and mAb, to toggle on one edge of each pulse. In one embodiment, mA and mAb change state on the positive-going edge of CLKOSb. An alternate embodiment uses the negative-going edge.

The latched address signals mA and mAb are conducted through the transmission gates to become signals sA and sAb respectively. These signals are then inverted with the output inverters 204 and 205 of FIG. 2. The output address signals are then Ab and A. It can be seen that these address signals A and Ab transition between a logic high and a logic low at every clock cycle.

Figure 4:
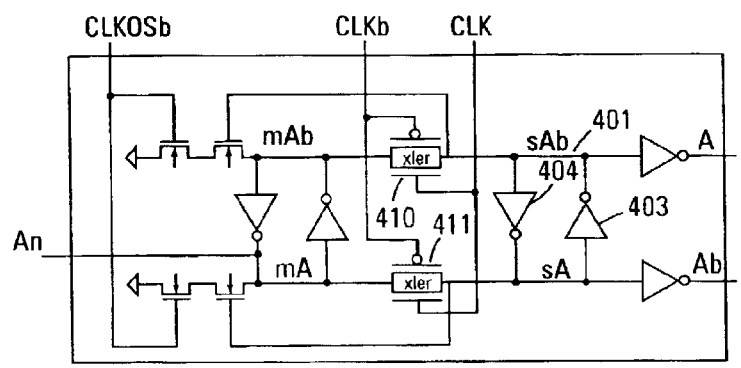
FIG. 4 shows a schematic diagram of an alternate embodiment of the symmetrical divide-by-2 circuit of the present invention.

FIG. 4 illustrates a schematic diagram of another embodiment of the symmetrical divide-by-2 circuit of the present invention. This embodiment is substantially similar to the embodiment of FIG. 2 except that a slave latch 401 has been added to create a static divider.

The slave latch of the embodiment of FIG. 4 has two low current identical inverters 403 and 404. The inverter's 403 and 404 function is to compensate for the leakage current of the diffusion of the transmission gates 410 and 411 for the time that the gates 410 and 411 are nonconductive. This embodiment may be used when the cycle time of the clock is long enough for the leakage to cause a problem with data retention.

Figure 5:
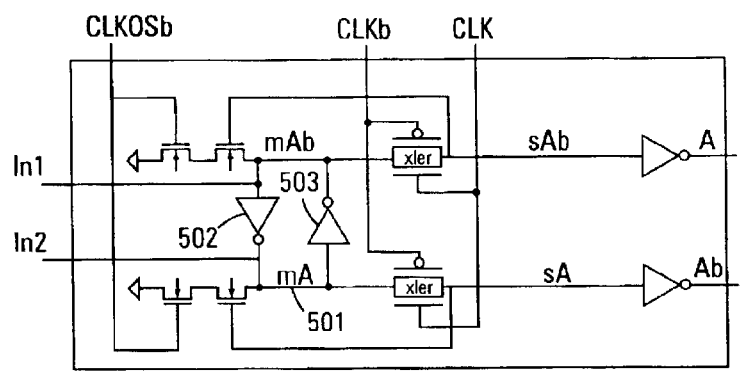
FIG. 5 shows a schematic diagram of another alternate embodiment of the symmetrical divide-by-2 circuit of the present invention.

FIG. 5 illustrates a schematic diagram of yet another embodiment of a symmetrical divide-by-2 circuit of the present invention. This embodiment differs from the embodiment of FIG. 2 in that both ends of the master latch, In1 and In2, are available to the inverted or non-inverted address. Using two inputs In1 and In2 enables the address latch circuit of FIG. 8 to put the initial address in the master latch 501. This circuit has the advantage of being symmetrical regarding the capacitive loading at mA and mAb. Being symmetrical, the address latch circuit of FIG. 8 pulls down mA or mAb, whichever happens to be high. In doing so, it overwrites only the p-channel device of the inverter 502 or 503.

The embodiments of the symmetrical divide-by-2 circuit illustrated in FIGS. 2, 4, and 5 enable the output address signals, inverted and non-inverted, to change state simultaneously after one gate delay of the clock transition. This reduces the data contention on the data output bus that is experienced in a prior art address generator.

Figure 6:
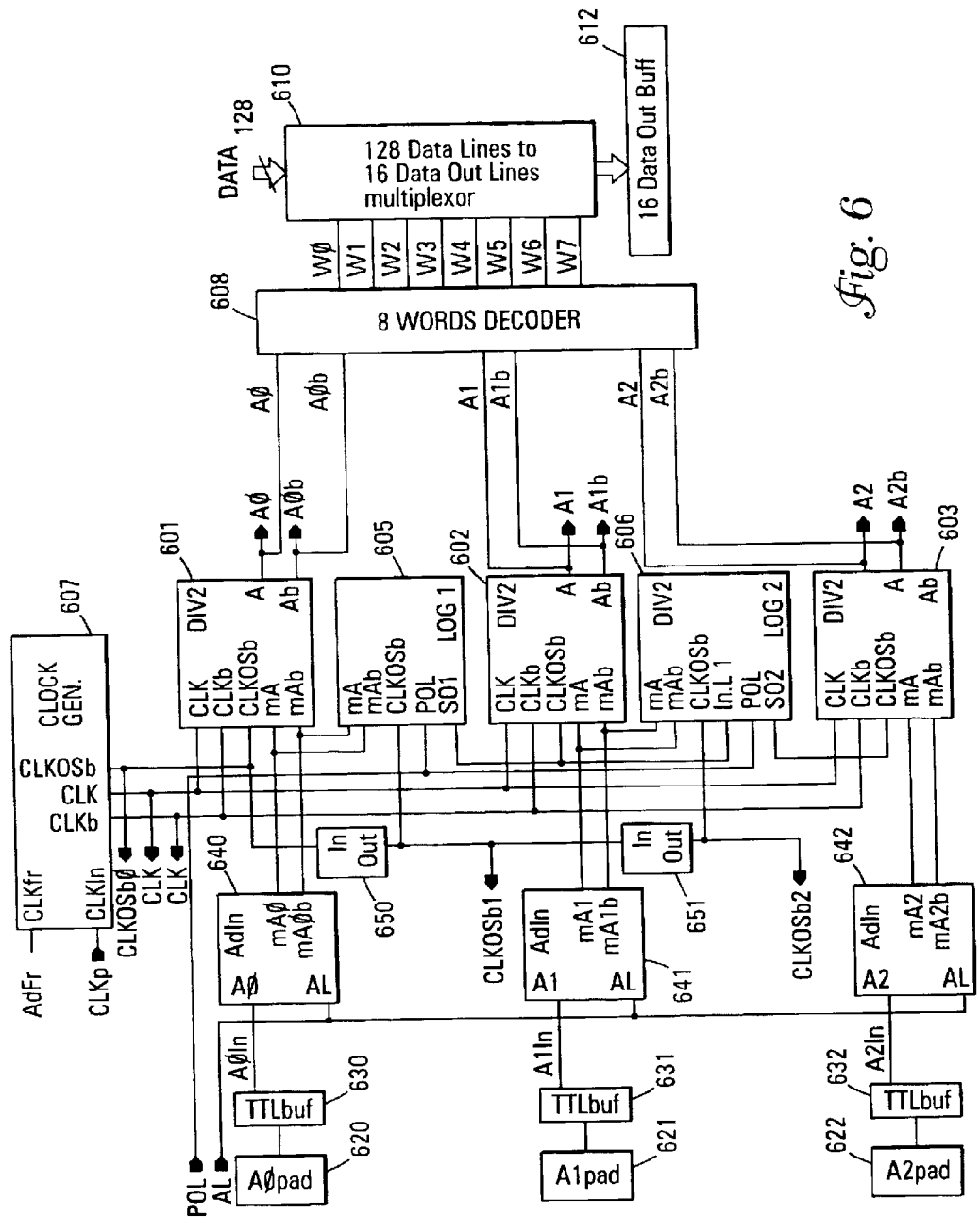
FIG. 6 shows a block diagram of one embodiment of the fast synchronous address generator of the present invention.

FIG. 6 illustrates a block diagram of one embodiment for a synchronous up/down address generator circuit of the present invention using at least one embodiment of a symmetrical divide-by-2 circuit as illustrated in FIGS. 2, 4, and 5.

The address generator circuit is clocked by the clock signals CLK, CLKb, and CLKOSb that are generated by a clock generator circuit 607. The clock generator circuit 607 uses input clock signal CLKp and address stop signal AdFr to control generation of the output clock signals.

The input clock signal CLKp, in one embodiment, is generated by an oscillator circuit (not shown). Alternate embodiments generate this clock in other ways.

The address stop signal AdFr is a control signal that instructs the address generator circuit when to stop the burst read operation. This signal, in one embodiment, may be generated by the controller circuit of the memory device. The clock circuit 607 is subsequently described and illustrated in greater detail with reference to FIG. 7.

Address inputs to the address generator circuit are provided by address signal input pads 620–622. The address pads 620–622 provide the starting address for the burst read operation.

The address signals from the address signal input pads are input through TTL buffers 630–632. These buffers provide the necessary current to the address signals to drive various components of the address generator circuit of the present invention.

The address signals A0In, A1In, and A2In from the buffers are input to address input circuits 640–642. One embodiment of an address input circuit 640–642 is illustrated in greater detail in FIG. 8.

The address input circuits transfer the address from the TTL buffers 630–632 to the master latches of the divide-by-2 circuits 601–603. The address signals A0In, A1In, and A2In are transferred to the counter through the address input circuits 640–642 when the address latch signal AL is a logic high. In one embodiment, the address latch signal AL is generated by the controller circuit of the memory device when the address signals are available.

The address input circuits 640–642 generate latched address signals mA0, mA1, and mA2 as well as their inverse signals mA0b, mA1b, and mA2b respectively. These signals arc input to the symmetrical divide-by-2 circuits 601–603 of the present invention.

The clock signals CLK, CLKb, and CLKOSb are input to the symmetrical divide-by-2 circuits 601–603. Two clock signals are involved in increasing or decreasing the address, depending on the embodiment, CLK and CLKb. These clock signals CLK and CLKb transfer the addresses from the master latch to the gate capacitance acting as a slave latch, as described previously with reference to FIG. 2. The other clock signal, CLKOSb, changes the state of the master latch, in accordance with the state of the slave latch, half a clock cycle ahead of the address to be generated.

Two logic circuits 605 and 606 are used to provide a proper change of the addresses in the master latches of the divide-by-2 circuits for A1 and A2, respectively. These circuits 605 and 606 are subsequently illustrated in greater detail with reference to FIG. 9. A polarity control signal POL is input to the logic circuits 605 and 606 to control whether the address generator circuit counts up or down from the input starting address. In one embodiment, the polarity signal POL is generated by the controller circuit of the memory device.

A delay circuit 650 between the CLKOSb of the first divide-by-2 circuit 601 and the first logic circuit 605 introduces a delay into the CLKOSb signal used to clock the A1 divide-by-2 circuit 602. This delayed clock signal, CLKOSb1, compensates for the delay between the CLKOSb signal and mA, mAb for address bit A0. The CLKOSb1 signal delays clocking the A1 divide-by-2 circuit 602 until after clocking of the A0 circuit.

Similarly, a second delay circuit 651 introduces a second delay into the CLKOSb1 signal from the A1 divide-by-2 circuit 602 in order to generate the clock signal CLKOSb2 for the A2 divide-by-2 circuit 603. The CLKOSb2 signal delays clocking the A2 divide-by-2 circuit 603 until after clocking of the A0 and A1 circuits, respectively.

In one embodiment, the delay circuits 650 and 651 introduce two gate delays into each clock signal. Alternate embodiments introduce other delays.

A decoder circuit 608 uses the address signals A0, A0b, A1, A1b, A2, A2b to generate word select signals that are input to a multiplexer 610. The multiplexer selects, in response to the word select signals, sets of 16 bit words from the input data lines.

In operation, the starting address is input to the address generator circuit through the address pads 620–622 and buffers 630–631 to be latched 640–642 with the latch signal AL. The polarity signal POL selects whether the address counting is to count up or down during the burst read operation.

The clock generator 607, under control of AdFr, generates CLK, CLKb, and CLKOSb. CLK and CLKb are directly connected to the divide-by-2 circuits 601–603 and enable the increase or decrease of A0, A1, and A2 synchronously. The clock CLKOSb acts on the divide-by-2 circuits 601–603 asynchronously through the delay circuits 650, 651 and the logic circuits 605 and 606. CLKOSb does not change directly the address for A1 and A2 but makes the necessary changes inside divide-by-2 circuits 601–603 half a clock period ahead of address changes.

The output addresses A0, A0b, A1, A1b, A2, and A2b are then input to the eight word decoder circuit 608 to generate the word select signals from the address inputs. The 128 data lines to 16 data lines multiplexer 610 uses the word select signals to select from the 128 bit data input signals. The selected 16 bit output word is then stored in a buffer 612 or used elsewhere in the memory device.

FIG. 7 illustrates a schematic diagram of one embodiment of the clock generator circuit 607 of the present invention. This circuit 607 uses the AdFr signal to control generation of the clock signals by inputting the CLKp and AdFr signals into a logical NOR gate 701. When AdFr is a logical high, the CLKp signal is disabled from clocking the clock generator circuit 607, thus disabling the address generator circuit. When AdFr is a logical low, the CLKp signal is allowed through the NOR gate 701 in an inverted form. An inverter gate 702 is then used to generate CLK in the same phase as CLKp. CLKb is output from the NOR gate 701 as the inverse of CLK.

Three inverter gates 705–707 provide delay for the CLK signal that is input to one side of a second NOR gate 710. This delay, along with the transistor 712, provides the one-shot effect from the NOR gate 710 on the falling edge of the CLK signal. The output of this NOR gate 710 is the CLKOSb signal used to changes the master latch status in the symmetrical divide-by-2 circuits 601–603. After this operation is performed by CLKOSb, the addresses A0, A1, and A2 are synchronously changed by CLK and CLKb.

In an alternate embodiment, tie CLKOSb signal is generated by the rising edge of CLKb when this edge occurs after the falling edge of CLK or in cases where there is uncertainty as to which deactivating edge of CLK or CLKb occurred last. CLKOSb is a self-aligning signal that automatically identifies the last edge so that CLKOSb becomes active after the transmission gates 210 and 211 of FIG. 2 become non-conductive.

The width of CLKOSb can be made short if the address change of the master latch 201 of FIG. 2 occurs rapidly. In one embodiment, the width of CLKOSb should be larger than the time necessary for the inverters 202 and 203 of the master latch to change from high-to-low or low-to-high, depending on the embodiment, through the transistors 206–209. This enables the symmetrical divide-by-2 circuit to operate at a higher clock frequency than prior art divide-by-2 circuits.

The clock generator of FIG. 7 is for purposes of illustration only. The present invention is not limited to any one clock generator circuit or one-shot architecture.

FIG. 8 illustrates the address latch circuits 640–642 of FIG. 6. When the input address A of the latch circuit is high and the address latch signal AL is activated (e.g., active high), the master latch of the divide-by-2 circuit will change its output signals to mA=high and mAb=low through the n-channel transistors 801 and 802. If the address input signal A of the latch is low the master latch will change the status to mA=low and mAb=high through the n-channel transistors 803 and 804.

FIG. 9 illustrates the first logic circuit 605 of FIG. 6. This circuit 605 generates the clock SO1 for the A1 divide-by-2 circuit 602. The inputs mA and mAb are provided by the A0 divide-by-2 circuit 601. The output of the circuit 605, SO1, is connected to the CLKOSb input of the A1 divide-by-2 circuit 602 of FIG. 6.

Two transmission gates 901 and 902 and an inverter gate 905 of the logic circuit 605 act as a multiplexer circuit with the polarity signal POL to select one of mAb or mA enable the NAND gate 903. The CLKOSb signal is allowed to pass inverted when either mA or mAb is a logical high. An inverter gate 904 then restores CLKOSb to its original phase. Therefore, the SO1 signal is activated only at every second cycle of the burst read clock, CLKp.

FIG. 10 illustrates the second logic circuit 606 of FIG. 6. This circuit 606 generates the clock SO2 for the A2 divide-by-2 circuit 603. The inputs mA and mAb are provided by the A1 divide-by-2 circuit 602. The output of the circuit 606, SO2, is connected to the CLKOSb input of the A2 divide-by-2 circuit 603 of FIG. 6.

Two transmission gates 1001 and 1002 and inverter gate 1005 act as a multiplexer circuit with the polarity signal POL to select one of mAb or mA through to the NAND gate 1003. InL1 into the NAND gate 1003 is the SO1 output of the first logic circuit 605. This signal, in combination with the mA or mAb signals, allows the CLKOSb signal to pass inverted only at every fourth cycle of the burst read clock, CLKp. An inverter gate 1004 then restores the CLKOSb to its original phase.

The embodiments of the logic circuits illustrated in FIGS. 9 and 10 are for purposes of illustration only. Alternate embodiments may use different circuitry to perform substantially the same function. In one embodiment, the delay circuits 650 and 651 of FIG. 6 may be incorporated into the logic circuits.

Figure 11:
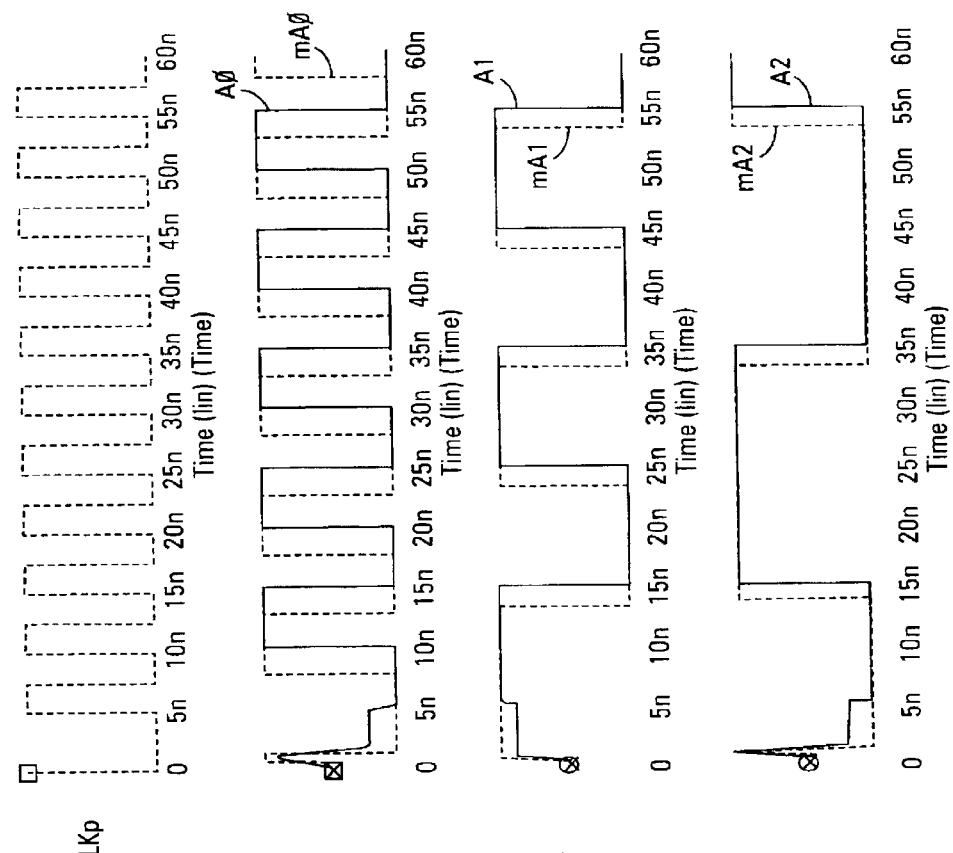
FIG. 11 shows a timing diagram in accordance with the embodiment of FIG. 6.

FIG. 11 illustrates a timing diagram of the address generator of the present invention in accordance with the embodiment of FIG. 6. The top waveform shows the burst read clock CLKp from which the other clocks of the address generator are derived.

The lowest address bit, A0, changes state every rising edge of CLKp. Address bit A1 changes state every two cycles of CLKp. Address bit A2 changes state every four cycles of CLKp.

Figure 12:
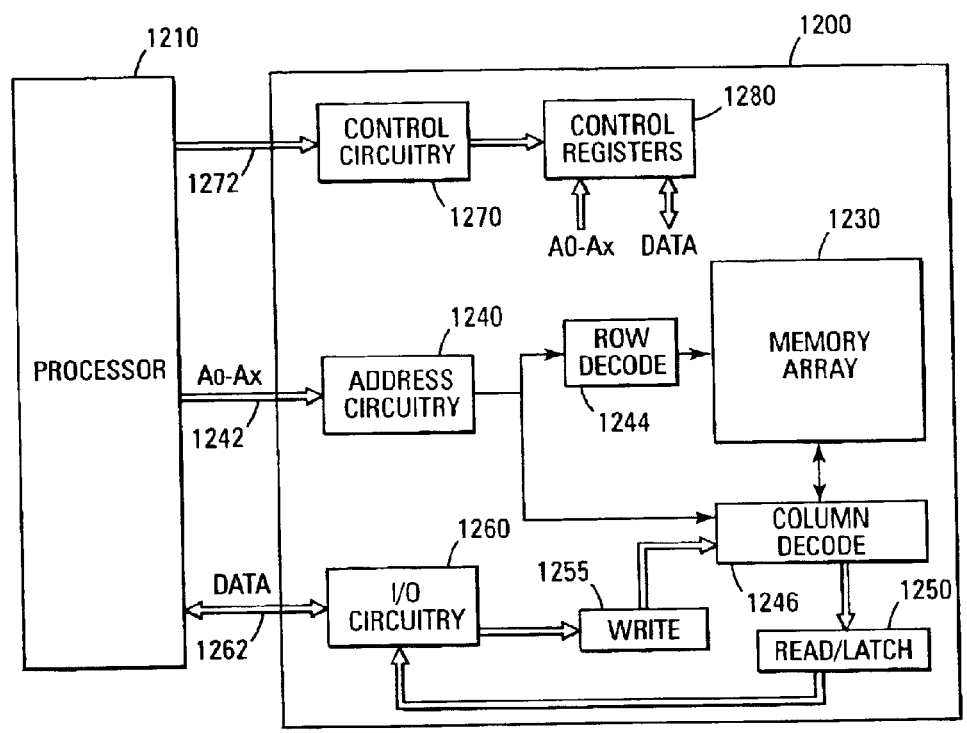
FIG. 12 shows a block diagram of one embodiment of an electronic system of the present invention.

FIG. 12 illustrates a functional block diagram of a memory device 1200 of one embodiment of the present invention that is coupled to a processor 1210. The processor 1210 may be a microprocessor, a processor, or some other type of controlling circuitry. The memory device 1200 and the controller 1210 form part of an electronic system 1220. The memory device 1200 has been simplified to focus on features of the memory that are helpful in understanding the present invention.

The memory device includes an array of memory cells 1230. In one embodiment, the memory cells are non-volatile floating-gate memory cells and the memory array 1230 is arranged in banks of rows and columns. In one embodiment, the memory array is a NAND-type architecture. In another embodiment, the memory array is a NOR-type architecture. The present invention is not limited to any one type of memory array architecture.

Address circuitry 1240 is provided to latch address signals provided on address input connections A0–Ax 1242. The address circuitry 1240, in one embodiment, comprises the address generator of the present invention.

Address signals are received and decoded by a row decoder 1244 and a column decoder 1246 to access the memory array 1230. It will be appreciated by those skilled in the art, with the benefit of the present description, that the number of address input connections depends on the density and architecture of the memory array 1230. That is, the number of addresses increases with both increased memory cell counts and increased bank and block counts.

The memory device 1200 reads data in the memory array 1230 by sensing voltage or current changes in the memory array columns using sense/latch circuitry 1250. The sense/latch circuitry, in one embodiment, is coupled to read and latch a row of data from the memory array 1230. Data input and output buffer circuitry 1260 is included for bi-directional data communication over a plurality of data connections 1262 with the controller 1210). Write circuitry 1255 is provided to write data to the memory array.

Control circuitry 1270 decodes signals provided on control connections 1272 from the processor 1210. These signals are used to control the operations on the memory array 1230, including data read, burst read, data write, and erase operations. In one embodiment, the control circuitry 1270 is a microcontroller that executes the embodiments of the automatic test entry termination methods of the present invention.

The flash memory device illustrated in FIG. 12 has been simplified to facilitate a basic understanding of the features of the memory. A more detailed understanding of internal circuitry and functions of flash memories are known to those skilled in the art.

CONCLUSION

The embodiments of the present invention provide a symmetrical divide-by-2 circuit that uses a pair of clocks to transfer the address from a master latch to a dynamic slave latch and a single self-aligning one shot clock to change the address in the latch. The dynamic latch is formed from the capacitance of gates in the divide-by-2 circuit. The symmetrical divide-by-2 circuit can be used in an address generator to provide a fast burst read operation in a memory device.

The embodiments of the present invention are not limited to any one type of memory technology. For example, the memory array may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalent thereof.

What is claimed is:

1. A symmetrical divide-by-2 circuit comprising:
   a master latch that holds a data signal;
   a dynamic slave latch for capacitively storing the data signal from the master latch; and
   a plurality of transmission gates, coupled to the master latch, that retains capacitance of the dynamic slave latch for a predetermined time interval.

2. The circuit of claim 1 wherein the master latch comprises a first and a second output and further including a first inverter gate on the first output and second inverter gate on the second output.

3. The circuit of claim 2 wherein the first and second inverter gates comprise the capacitance of the dynamic slave latch.

4. The circuit of claim 1 wherein the data signal is an address signal.

5. The circuit of claim 1 wherein the input data is transferred from the master latch to the dynamic slave latch in response to at least one clock signal.

6. The circuit of claim 5 wherein the at least one clock signal comprises a first and a second clock signal that are substantially inverse of each other and that control operation of the plurality of transmission gates and a third clock signal that enables a change in state of the master latch.

7. The circuit of claim 5 wherein the predetermined time interval is one-half a clock cycle of the at least one clock signal.

8. A symmetrical divide-by-2 circuit for use in a memory device having an address signal input and a burst read clock signal, the circuit comprising:
   a data input that is coupled to the address signal input for accepting address data;
   a master latch, having a first side coupled to the data input, that holds the address data;
   a dynamic slave latch for capacitively storing the address data from the master latch in response to a first clock signal; and
   a plurality of transmission gates, coupled to the master latch, that retains the address data in the capacitance of the dynamic slave latch in response to a second clock signal and an inverse of the second clock signal.

9. The circuit of claim 8 wherein the master latch has a first side coupled to the dynamic slave latch through a first transmission gate and a second side coupled to the dynamic slave latch through a second transmission gate.

10. The circuit of claim 8 and further including a clock generator circuit coupled to the burst read clock signal for generating the second clock signal and the inverse of the second clock signal, the clock generator circuit comprising a one-shot circuit that generates the first clock signal.

11. An address generator in a memory device, the generator comprising:
    a plurality of address inputs for accepting a burst read start address;
    a plurality of symmetrical divide-by-2 circuits each comprising a master latch for storing the burst read start address coupled to a dynamic slave latch for capacitively storing the burst read start address, the master latch and the dynamic slave latch separated by transmission gates; and
    a clock generator circuit comprising a one-shot circuit that generates an address increment/decrement clock to each of the plurality of symmetrical divide-by-2 circuits such that the burst read start address is either incremented or decremented in response to a polarity signal, the clock generator circuit further generating an enable clock and an inverse enable clock that are coupled to the transmission gates for enabling a transfer of data from the master latch to the slave latch.

12. The generator of claim 11 and further comprising a delay circuit coupled to the address increment/decrement clock between each of the plurality of symmetrical divide-by-2 circuits such that the address increment/decrement clock to each successive symmetrical divide-by-2 circuit is delayed a predetermined quantity of clock cycles.

13. The generator of claim 12 wherein the predetermined quantity of clock cycles between a first and a second symmetrical divide-by-2 circuit is two and the predetermined quantity of clock cycles between the second and a third symmetrical divide-by-2 circuit is four.

14. The generator of claim 11 wherein the master latch statically stores the burst read start address.

15. The generator of claim 11 and further including a plurality of latches coupled to the plurality of address inputs for latching the burst read start address in response to an address latch signal.

16. An address generator in a memory device, the address generator comprising:
    a plurality of address inputs for accepting a burst read start address;
    a plurality of symmetrical divide-by-2 circuits each comprising a master latch for storing the burst read start address coupled to a dynamic slave latch for capacitively storing the burst read start address, the master latch and the dynamic slave latch separated by transmission gates, the plurality of symmetrical divide-by-2 circuits forming at least a first, second, and third stage whose outputs comprise a memory address;
    a clock generator circuit comprising a one-shot circuit that generates an address increment/decrement clock to each stage such that the burst read start address is either incremented or decremented in response to a polarity signal, the clock generator circuit further generating an enable clock and an inverse enable clock that are coupled to the transmission gates for enabling a transfer of data from the master latch to the slave latch;
    a first logic circuit coupling the first stage to the second stage, the first logic circuit introducing a first clock cycle delay in the address increment/decrement clock; and
    a second logic circuit coupling the second stage to the third stage, the second logic circuit introducing a second clock cycle delay in the address increment/decrement clock.

17. The generator of claim 16 wherein the memory device is a NAND flash memory device.

18. The generator of claim 16 wherein the memory device is a NOR flash memory device.

19. The generator of claim 16 wherein the first clock cycle delay is two clock cycles and the second clock cycle delay is four clock cycles.

20. The generator of claim 16 wherein the one-shot circuit is self-aligned to a latest transition of either the enable clock or the inverse enable clock.

21. The generator of claim 16 wherein there is one clock cycle.

22. The generator of claim 16 wherein the dynamic slave latch stores data from the master latch while the transmission gates are non-conductive.

23. The generator of claim 16 wherein the first and second logic circuits are comprised of a multiplexer circuit that chooses between a first and a second address signal from a previous stage in response to the polarity signal.

24. A memory device having a burst read mode, the device comprising:
- a memory array for storing data;
- a controller circuit that generates control signals for the memory device including a polarity signal; and
- addressing circuitry, coupled to the memory array and the controller circuit, comprising an address generator for generating a plurality of sequential memory addresses, from a burst read start address, during the burst read mode, the generator comprising:
  - a plurality of symmetrical divide-by-2 circuits each comprising a master latch for storing the burst read start address coupled to a dynamic slave latch for capacitively storing the burst read start address, the master latch and the dynamic slave latch separated by transmission gates; and
  - a clock generator circuit comprising a one-shot circuit that generates an address increment/decrement clock to each of the plurality of symmetrical divide-by-2 circuits such that the burst read start address is either incremented or decremented in response to the polarity signal, the clock generator circuit further generating an enable clock and an inverse enable clock that are coupled to the transmission gates for enabling a transfer of data from the master latch to the dynamic slave latch.

25. A memory device having a burst read mode, the device comprising:
- a memory array for storing data;
- a controller circuit that generates control signals for the memory device; and
- addressing circuitry, coupled to the memory array and the controller circuit, comprising a symmetrical divide-by-2 circuit having a master latch that holds a data signal coupled to a dynamic slave latch through a plurality of transmission gates, the dynamic slave latch capacitively storing the data signal from the master latch during a time interval that the transmission gates are non-conductive.

26. The memory device of claim 25 wherein the symmetrical divide-by-2 circuit comprises an input line coupled to each end of the master latch.

27. An electronic system comprising:
- a processor that controls operation of the electronic system; and
- a memory device having a burst read mode, the device comprising:
  - a memory array for storing data;
  - a controller circuit that generates control signals for the memory device; and
  - addressing circuitry, coupled to the memory array and the controller circuit, comprising a symmetrical divide-by-2 circuit having a master latch that holds a data signal coupled to a dynamic slave latch through a plurality of transmission gates, the dynamic slave latch capacitively storing the data signal from the master latch during a time interval that the transmission gates are non-conductive.

* * * * *